United States Patent
Lee et al.

(10) Patent No.: US 12,532,679 B2
(45) Date of Patent: Jan. 20, 2026

(54) SUBSTRATE PROCESSING METHOD, SUBSTRATE PROCESSING DEVICE, AND METHOD OF MANUFACTURING A SEMICONDUCTOR DEVICE

(71) Applicant: Samsung Electronics Co., Ltd., Suwon-si (KR)

(72) Inventors: Ji Mo Lee, Suwon-si (KR); Dong Hyeon Na, Suwon-si (KR); Myeong Soo Shin, Suwon-si (KR); Woong Jin Cheon, Suwon-si (KR); Kyung-Sun Kim, Suwon-si (KR); Jae Bin Kim, Suwon-si (KR); Tae-Hwa Kim, Suwon-si (KR); Seung Bo Shim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 18/370,268

(22) Filed: Sep. 19, 2023

(65) Prior Publication Data

US 2024/0120177 A1   Apr. 11, 2024

(30) Foreign Application Priority Data

Oct. 11, 2022 (KR) .................. 10-2022-0129804
Mar. 20, 2023 (KR) .................. 10-2023-0035865

(51) Int. Cl.
*H01L 21/3065* (2006.01)
*H01J 37/32* (2006.01)

(52) U.S. Cl.
CPC .... *H01L 21/3065* (2013.01); *H01J 37/32146* (2013.01); *H01J 37/32174* (2013.01); *H01J 37/3266* (2013.01); *H01J 37/32669* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 2005/0092596 A1* | 5/2005 | Kouznetsov | H01J 37/3408 204/192.12 |
| 2011/0201134 A1 | 8/2011 | Hoffman et al. | |
| 2014/0318710 A1 | 10/2014 | Chae et al. | |

FOREIGN PATENT DOCUMENTS

| | | | |
|---|---|---|---|
| KR | 1019980040612 A | 8/1998 | |
| KR | 1020050078275 A | 8/2005 | |
| KR | 1020060087451 A | 8/2006 | |
| KR | 1020130085908 A | 7/2013 | |
| KR | 1020150063304 A | 6/2015 | |
| KR | 1020170136438 A | 12/2017 | |
| WO | WO2022108755 * | 5/2022 | ............. H01J 37/32 |

* cited by examiner

*Primary Examiner* — Jiong-Ping Lu
(74) *Attorney, Agent, or Firm* — Muir Patent Law, PLLC

(57) ABSTRACT

A substrate processing method is provided. The substrate processing method comprises loading a substrate onto a substrate support inside a chamber, forming a plasma inside the chamber, providing a first DC pulse signal to an electromagnet that generates a magnetic field inside the chamber and processing the substrate with the plasma, wherein the first DC pulse signal is repeated at a first period including a first section and a second section subsequent to the first section, the first DC pulse signal has a first level during the first section, and the first DC pulse signal has a second level different from the first level during the second section.

18 Claims, 22 Drawing Sheets

SUBSTRATE PROCESSING METHOD, SUBSTRATE PROCESSING DEVICE, AND METHOD OF MANUFACTURING A SEMICONDUCTOR DEVICE

CROSS-REFERENCE TO RELATED APPLICATION

This application claims priority to Korean Patent Application No. 10-2022-0129804 filed on Oct. 11, 2022 and No. 10-2023-0035865 filed on Mar. 20, 2023 in the Korean Intellectual Property Office, the contents of each of which in their entirety are herein incorporated by reference.

BACKGROUND

1. Field of the Invention

Aspects of the present invention relate to a substrate processing method and a substrate processing device, and a method of manufacturing a semiconductor device.

2. Description of the Related Art

Various processes such as etching, ashing, ion implantation, thin film deposition, and cleaning are performed when fabricating a semiconductor device or a display device. Plasma may be used in such various processes.

Typically, a precise plasma control is required due to a pattern miniaturization or the like. For example, a DC signal or the like may be provided to electrodes inside a process chamber to form a uniform distribution of plasma on a substrate. However, discrepancies in the uniformity tend to exist.

SUMMARY

Aspects of the present invention provide a substrate processing method and method of manufacturing a semiconductor device having improved process characteristics.

Aspects of the present invention also provide a substrate processing device having improved process characteristics.

According to some aspects of the present inventive concept, a method of manufacturing a semiconductor device includes loading a substrate onto a substrate support inside a chamber, forming a plasma inside the chamber, providing a first DC pulse signal to an electromagnet that generates a magnetic field inside the chamber and processing the substrate with the plasma while providing the first DC pulse signal. The first DC pulse signal is repeated at a first period to include a plurality of cycles, each cycle having the first period and including a first section and a second section subsequent to the first section. The first DC pulse signal is at or above a first level during the first section, and the first DC pulse signal is at or below a second level different from the first level during the second section.

According to some aspects of the present inventive concept, a method of manufacturing a semiconductor device includes loading a substrate onto a substrate support inside a chamber, forming a plasma inside the chamber, providing a first DC pulse signal to a first electromagnet and providing a second DC pulse signal to a second electromagnet, to generate a magnetic field inside the chamber, and processing the substrate with the plasma. The first DC pulse signal is repeated at a first period to include a plurality of first cycles, each first cycle including a first section and a second section subsequent to the first section, the second DC pulse signal is repeated at a second period to include a plurality of second cycles, each second cycle including a third section and a fourth section subsequent to the third section, the first DC pulse signal is at a first level during the first section, the first DC pulse signal is at a second level different from the first level during the second section, the second DC pulse signal is at a third level during the third section, and the second DC pulse signal is at a fourth level different from the third level during the fourth section.

According to some aspects of the present inventive concept, a method of manufacturing a semiconductor device includes loading a substrate onto a substrate support inside a chamber, providing a source power signal to a first electrode inside the chamber to form a plasma inside the chamber, providing a first DC pulse signal to an electromagnet that generates a magnetic field inside the chamber, providing an AC signal to a second electrode inside the chamber, and etching the substrate with the plasma. The first DC pulse signal is repeated at a first period to include a plurality of cycles, each cycle including a first section and a second section subsequent to the first section, the first DC pulse signal is at or above a first level during the first section, the first DC pulse signal is at a second level different from the first level during the second section, and the first section has a duration of 0.1 seconds to 10 seconds, and the second section has a duration of 0.1 second to 10 seconds.

According to some aspects of the present inventive concept, a substrate processing device includes a process chamber which forms an internal space, a substrate support which is disposed inside the process chamber, and supports the substrate, a first electrode which generates a plasma in the internal space, an electromagnet which controls distribution of plasma of the internal space, and a DC power supply unit which supplies a DC pulse signal to the electromagnet. The DC pulse signal is repeated at a first period to include a plurality of cycles having the first period, each cycle including a first section and a second section subsequent to the first section, the DC pulse signal has a first level during the first section, the DC pulse signal has a second level different from the first level during the second section, and the first section has a duration of 0.1 seconds to 10 seconds, and the second section has a duration of 0.1 seconds to 10 seconds.

However, aspects of the present invention are not restricted to the one set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Hereinafter, embodiments according to the technical idea of the present invention will be described with reference to the accompanying drawings.

Figure 1:
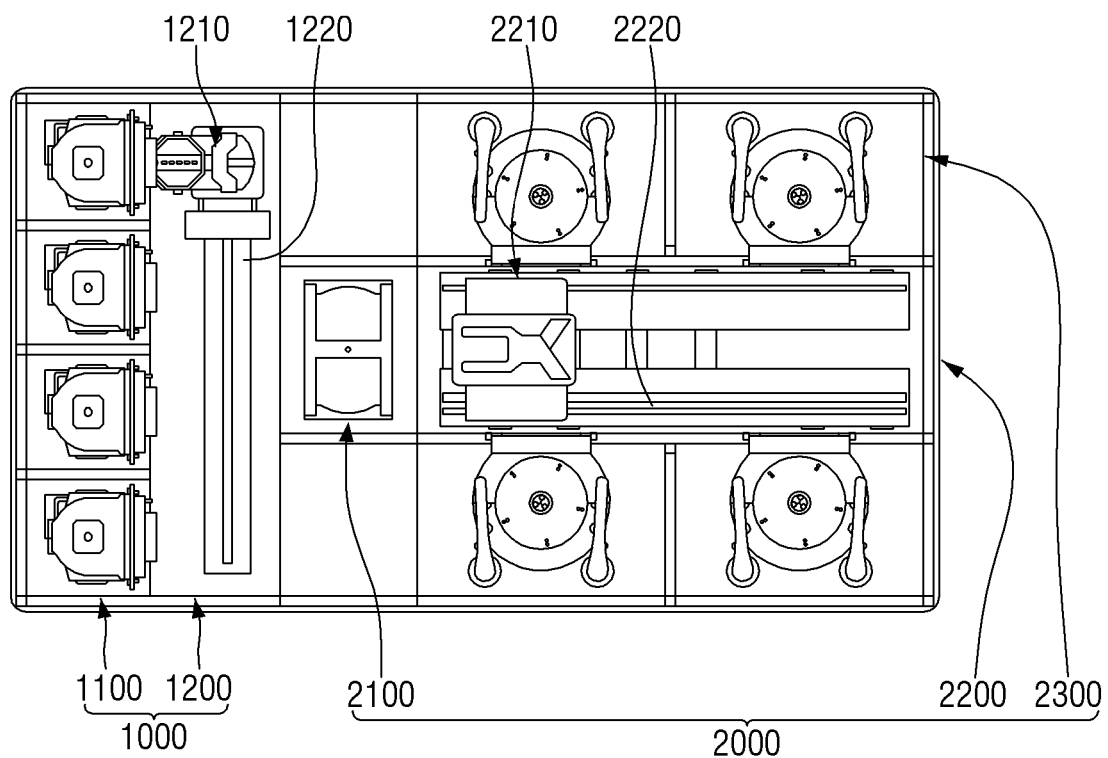
FIG. 1 is a diagram for explaining a substrate processing system according to some embodiments.

FIG. 1 is a diagram for explaining a substrate processing system according to some embodiments.

Referring to FIG. 1, the substrate processing system according to some embodiments may include an index module 1000 and a process module 2000.

The index module 1000 receives a substrate from the outside and transports the substrate to the process module 2000. The process module 2000 may perform at least one of a cleaning process, a deposition process, an etching process, and an ashing process. The index module 1000 may be an equipment front end module (EFEM). The index module 1000 may include a load port 1100 and a transport frame 1200.

The load port 1100 may accommodate the substrate. The substrate may be placed on a container inside the load port 1100. A front opening unified pod (FOUP) may be used as the container. The container may be loaded into the load port 1100 from the outside by an overhead transfer (OHT). The container may be unloaded from the load port 1100 by the overhead transfer. The transport frame 1200 may transport the substrate between the container placed on the load port 1100 and the process module 2000.

The process module 2000 may be a module that actually performs a process on a substrate. The process module 2000 may include a buffer chamber 2100, a transfer chamber 2200, and a process chamber 2300. In some embodiments, the process chamber 2300 may be in the form of a tower including a plurality of chambers, but the embodiments are not limited thereto.

The buffer chamber 2100 may provide a space in which the substrate transported between the index module 1000 and the process module 2000 temporarily stays. The buffer chamber 2100 may provide a buffer slot on which the substrate is placed. The transfer robot 2210 of the transfer chamber 2200 may withdraw the substrate placed on the buffer slot and transport it to the process chamber 2300. The buffer chamber 2100 may provide the plurality of buffer slots.

The transfer chamber 2200 may transport the substrate between a buffer chamber 2100 and a process chamber 2300 disposed near it. The transfer chamber 2200 may include a transfer robot 2210 and transfer rails 2220. The transport robot 2210 may move on the transfer rails 2220 to transport the substrate.

In some embodiments, the process chamber 2300 may be a substrate processing device. For example, at least one of a cleaning process, a deposition process, an etching process, and an ashing process may be performed inside the process chamber 2300. More specifically, although the ashing process using plasma and/or radicals may be performed inside the process chamber 2300, the embodiments is not limited thereto. The process chamber 2300 may be one of a plurality of process chambers 2300.

Some chambers of the process chambers 2300 may be disposed on one side of the transfer chamber 2200. Other chambers of the process chambers 2300 may be disposed on the other side of the transfer chamber 2200. For example, the plurality of process chambers 2300 may be disposed to face the a transfer chamber 2200 formed between them.

A plurality of process chambers 2300 may be provided in the process module 2000. The plurality of process chambers 2300 may be arranged in a first row on one side of the transfer chamber 2200 and in a second row on a second side of the transfer chamber 2200. However, the technical idea of the present invention is not limited thereto.

The placement of the process chambers 2300 is not limited to the above example, and may be changed in consideration of the footprint of equipment, process efficiency, and the like.

Figure 2:
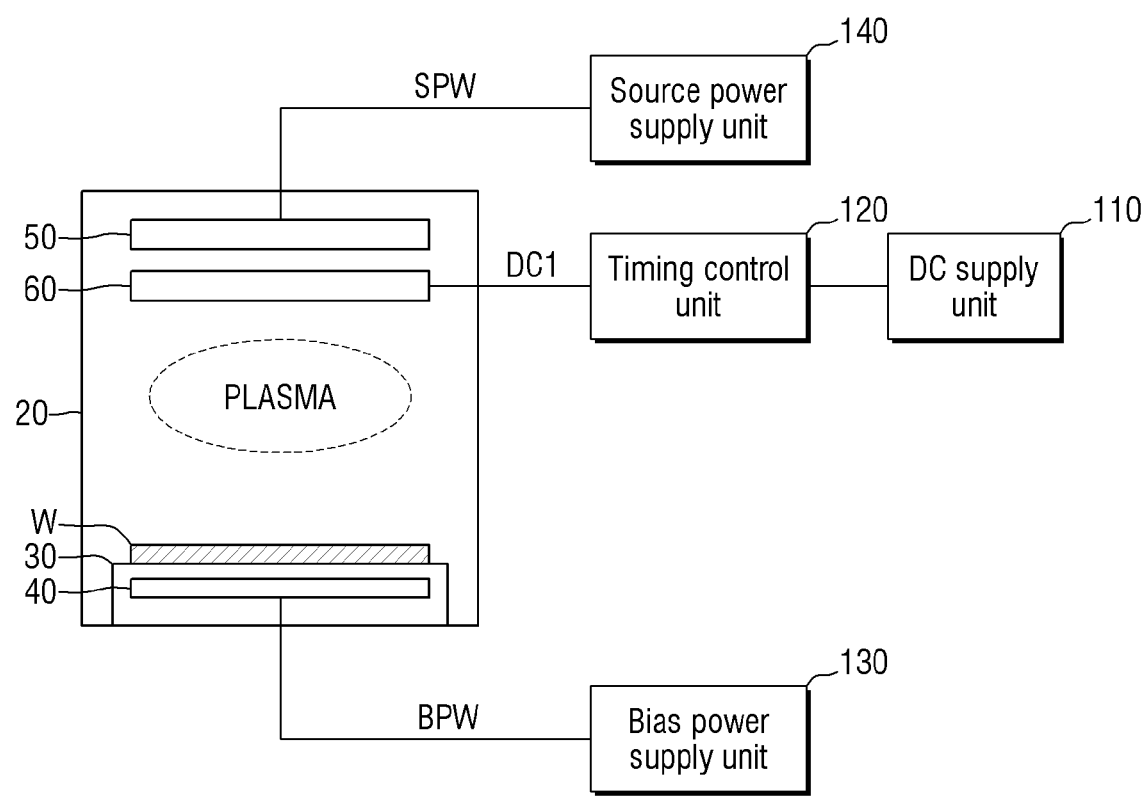
FIG. 2 is a diagram for explaining a substrate processing device according to some embodiments.

FIG. 2 is a diagram for explaining a substrate processing device according to some embodiments.

Referring to FIG. 2, the substrate processing device according to some embodiments may include a process chamber 20, a substrate support 30, a bias power electrode 40, a source power electrode 50, a plasma distribution control electromagnet 60, a DC supply unit 110, a timing control unit 120, a bias power supply unit 130, and a source power supply unit 140.

The substrate processing device according to some embodiments may be a chamber for processing a substrate W, using plasma and/or radicals. For example, the substrate W may be subjected to a plasma treatment process in the substrate processing equipment. As an example, the substrate W may be subjected to an etching process using plasma, but is not limited thereto. According to the embodiment, a deposition process, an ashing process, and a cleaning process may be performed together in the substrate processing equipment.

As used herein, the term "substrate" may mean the substrate itself, or a stacked structure including the substrate and a predetermined layer or film formed on the surface thereof. Also, the term "surface of substrate" may mean an exposed surface of the substrate itself, or an exposed surface of a predetermined layer or film formed on the substrate. For example, the substrate may include a wafer or at least one material film on the wafer. The material film may be an insulating film and/or a conductive film formed on the wafer by various methods such as deposition and coating plating. For example, the insulating film may include an oxide film, a nitride film, an oxynitride film, and the like, and the conductive film may include a metal film, a polysilicon film, and the like. On the other hand, the material film may be a single film or multiple films formed on the wafer. Also, the material film may be formed on the wafer to have a predetermined pattern.

The process chamber 20 may form an internal space. The substrate W may be processed in the internal space of the process chamber 20. The substrate W may be processed to form a semiconductor device, as described further below.

An overall external structure of the process chamber 20 may have a cylindrical pillar, elliptical pillar or polygonal pillar shape. The process chamber 20 is generally formed of a metal material, and an electrical ground state may be kept to block an external noise at the time of the plasma processing.

Although it is not shown, a liner may be provided inside the process chamber 20. The liner may protect the process chamber 20 and cover metal structures inside the process chamber 20 to prevent an occurrence of metal contamination due to internal arcing. On the other hand, the liner may be formed of a metallic material such as aluminum, a ceramic material, or the like. Also, the liner may be formed of a material film that is resistant to plasma. Here, the material film resistant to plasma may be, for example, an yttrium oxide ($Y_2O_3$) film. Of course, the material film resistant to plasma is not limited to the yttrium oxide film.

Although not shown, a showerhead may be disposed inside the process chamber 20. The showerhead may include a plurality of holes. The showerhead may inject gas through the plurality of holes, which then becomes plasma inside the chamber.

The substrate support 30 may be disposed at a lower part inside the process chamber 20. The substrate support 30 may support the substrate W. The substrate support 30 may also be described as a stage or platform.

The substrate support 30 may be an electrostatic chuck configured to support the substrate W with electrostatic force. The electrostatic chuck may include electrodes for chucking and dechucking the substrate W therein. A chuck support supports the electrostatic chuck disposed thereon, and may be formed of a metal such as aluminum or a ceramic insulator such as alumina. A heating member, such as a heater, is disposed inside the chuck support, and heat may be transferred from the heater to the electrostatic chuck or the substrate W. Also, a power applying wiring connected to the electrodes of the electrostatic chuck may be disposed on the chuck support. Of course, the configuration of the substrate support 30 is not limited thereto, and the substrate support 30 may include a vacuum chuck configured to support the substrate W using a vacuum or may be configured to mechanically support the substrate W.

A bias power electrode 40 may be disposed inside the substrate support 30. However, the embodiment is not limited thereto. As another example, the bias power electrode 40 may be disposed under the substrate support 30. The bias power electrode 40 may be electrically connected to the bias power supply unit 130.

The source power electrode 50 may be disposed at the upper part inside the process chamber 20. The source power electrode 50 may be disposed on the substrate support 30 (e.g., above the substrate support 30). The source power electrode 50 may be electrically connected to the source power supply unit 140. The source power electrode 50 may be provided with a source power signal SPW from the source power supply unit 140.

A plasma distribution control electromagnet 60 may be placed below the source power electrode 50. The plasma distribution control electromagnet 60 may be electrically connected to a DC supply unit 110. The plasma distribution control electromagnet 60 may be provided with a first DC pulse signal DC1. The plasma distribution control electromagnet 60 may be provided with the first DC pulse signal DC1 through the DC supply unit 110 and the timing control unit 120. The plasma distribution control electromagnet 60 may be secured within the process chamber 20 using a frame or other structure mounted on and within the process chamber 20, and may include, for example, an electromagnetic coil, such as a solenoid, connected to the DC supply unit DC1.

Although FIG. 2 shows that the plasma distribution control electromagnet 60 is disposed below the source power electrode 50, the embodiments are not limited thereto. For example, the plasma distribution control electromagnet 60 may be placed above the source power electrode 50. Spatially relative terms such as "above" and "below" as used herein have their ordinary broad meanings—for example element A can be above element B even if when looking down on the two elements there is no overlap between them (just as something in the sky is generally above something on the ground, even if it is not directly above). It will further be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

The DC supply unit 110 may generate a direct current (DC) signal. The DC supply unit 110 may provide a DC signal to the timing control unit 120. For example, the DC supply unit 110 may be a DC power source. The timing control unit 120 may change the DC signal provided from the DC supply unit 110 into a pulse signal. For example, the timing control unit 120 may control the times of sections at which the DC signal is turned on and off. The timing control unit 120, and other timing control units described herein, may include one or more circuits configured to generate the pulse signal based on the DC signal, and may be controlled by or be part of a controller or other hardware and/or software. The timing control unit 120, and other timing control units described herein, may be controlled based on, for example, user input to a computer that includes a display and input device, or an automated control process programmed into the computer. The timing control unit 120, and other timing control units described herein, may be described as a timing control circuit or timing controller.

The bias power supply unit 130 may provide a bias power signal BPW to the bias power electrode 40. The bias power signal BPW provided to the bias power electrode 40 may be an alternating current (AC) signal. For example, the bias power signal BPW may include an RF power signal. The bias power supply unit 130 may be an AC power source.

The source power supply unit 140 may provide the source power signal SPW to the source power electrode 50. The source power signal SPW provided to the source power electrode 50 may be a DC signal or an AC signal. The source power supply unit 140 may be an AC or DC power source.

FIGS. 3 to 6 are timing charts for explaining a DC pulse signal.

Figure 3:
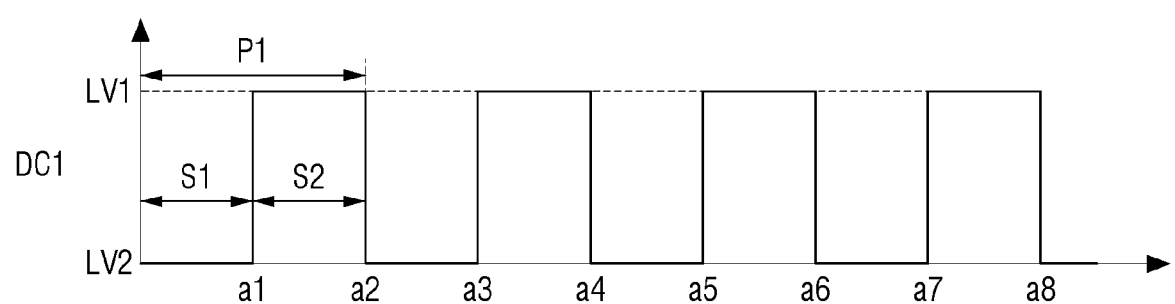
FIGS. 3 to 6 are timing charts for explaining a DC pulse signal.

Referring to FIGS. 2 and 3, the first DC pulse signal DC1 may have a first period P1. The first period P1 may have a first length of time. The first DC pulse signal DC1 may be repeated at the first period P1. Each cycle within the first DC pulse signal DC1 may have a length of time of the first period P1. It should be noted that ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first period P1 of the first DC pulse signal DC1 may include a first section S1 and a second section S2. The first section S1 may include, for example, a section from a start time point to a first time point a1. Also, the first section S1 may include a section from a second time point a2 to a third time point a3. The second section S2 may include, for example, a section from the first time point a1 to the second time point a2. Also, the second section S2 may include a section from the third time point a3 to the fourth time point a4. The first section S1 and second section S2 may also be described as first and second segments. Within a cycle of the DC pulse signal DC1, the overall length of time of the cycle may be the sum of the length of time of the first section S1 of the first period P1 and the length of time of the second section S2 of the first period P1. Each period may consist of a plurality of sections.

While the first DC pulse signal DC1 is being applied to the source power electrode 50, a ratio between the time of the first section S1 and the time of the second section S2 may be constant. The first DC pulse signal DC1 may have a duty cycle greater than 0% and less than 100%. The duty cycle may refer to a ratio of the duration of a section during which a level for one period is activated compared to the duration of the period.

For example, a duty cycle of the first DC pulse signal DC1 may refer to a ratio of the duration of the second section S2 having the first level LV1 compared to the duration of the first period P1. The duration of the first section S1 and the duration of the second section S2 may be equal. In this example, the duty cycle may be 50%. When the duration of the first section S1 and the duration of the second section S2 are equal, the duty cycle of the first DC pulse signal DC1 is 50%.

Although FIG. 3 shows that the duration of the first section S1 is equal to the duration of the second section S2, the embodiments are not limited thereto. For example, the duration of the first section S1 may be longer than the duration of the second section S2. As another example, the duration of the first section S1 may be shorter than the duration of the second section S2. The duration of the second section S2 in the first period P1 of the first DC pulse signal DC1 may be 70%. Therefore, the duty cycle of the first DC pulse signal DC1 may be 70%.

During the first section S1, the first DC pulse signal DC1 may have a second level LV2. For example, the second level LV2 may be 0. The level of the first DC pulse signal DC1 may be kept constant during the first section S1 (e.g., at the second level LV2).

During the second section S2, the first DC pulse signal DC1 may have the first level LV1. The first level LV1 may be different from the second level LV2. The level of the first DC pulse signal DC1 may be kept constant at the second section S2 (e.g., at the first level LV1).

As an example, the first section S1 and the second section S2 may each be 0.1 seconds to 10 seconds. For example, the first section S1 and the second section S2 may each be 1 second. The first DC pulse signal DC1 may be applied at the second level LV2 for one second during the first section S1, and may be applied at the first level LV1 for one second during the second section S2. The duration of the first section S1 may be the same as or different from the duration of the second section S2. To prevent eddy current loss or oversaturation due to long-time driving, the time amounts between 0.1 seconds and 10 seconds can be used.

Although FIG. 3 shows that the second level LV2 is 0, embodiments are not limited thereto. For example, the second level LV2 may not be 0.

Figure 4:
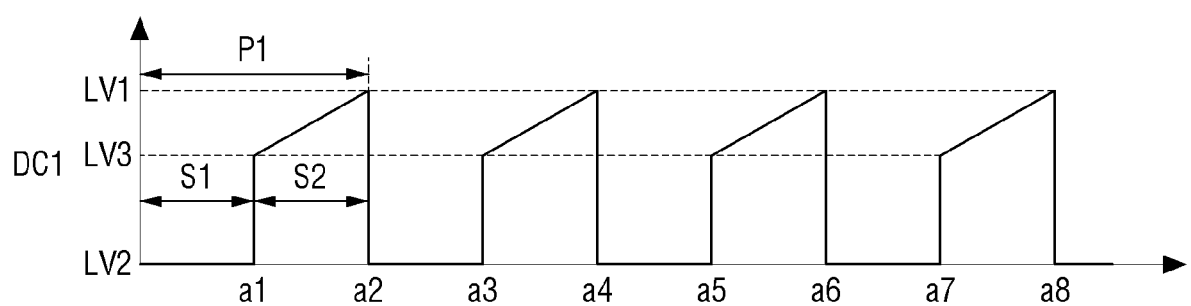

Referring to FIG. 4, the level of the first DC pulse signal DC1 may start changing at the start of the second section S2, and may change during the second section S2. The level of the first DC pulse signal DC1 may change at a constant slope during the second section S2. For example, the first DC pulse signal DC1 from the first time point a1 to the second time point a2 may increase from the third level LV3 to the first level LV1. Accordingly, the level of the first DC pulse signal DC1 during the section S2 may be at or above the third level LV3.

The first DC pulse signal DC1 is constant at the second level LV2 from the start time to the first time point a1, and the level of the signal may be changed from the second level LV2 to the third level LV3 at the first time point a1. The level of the first DC pulse signal DC1 may change at a constant slope from the first time point a1 to the second time point a2, and the level of the signal may change from the first level LV1 to the second level LV2 at the second time point a2. Also, though not shown, in some embodiments, the level of the first DC pulse signal DC1 during the first section S1 may have a slope rather than being constant, so that in either case, it is at or below the second level LV2.

The first section S1 and the second section S2 may each have a duration of 0.1 seconds to 10 seconds. For example, the second section S2 may have a duration of 0.1 seconds. The first DC pulse signal DC1 may increase from the third level LV3 to the first level LV1 for 0.1 seconds during the second section S2.

Figure 5:
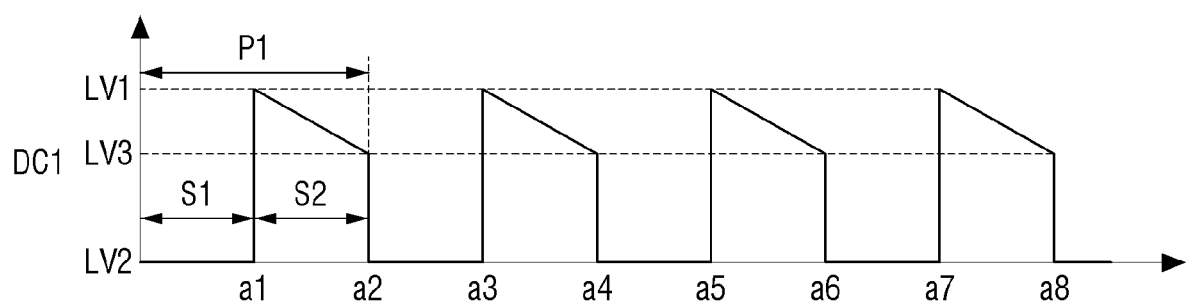

Referring to FIG. 5, the level of the first DC pulse signal DC1 may change during the second section S2. The level of the first DC pulse signal DC1 may change at a constant slope during the second section S2. For example, the first DC pulse signal DC1 from the first time point a1 to the second time point a2 may decrease from the first level LV1 to the third level LV3.

The first section S1 and the second section S2 may each be 0.1 seconds to 10 seconds.

Figure 6:
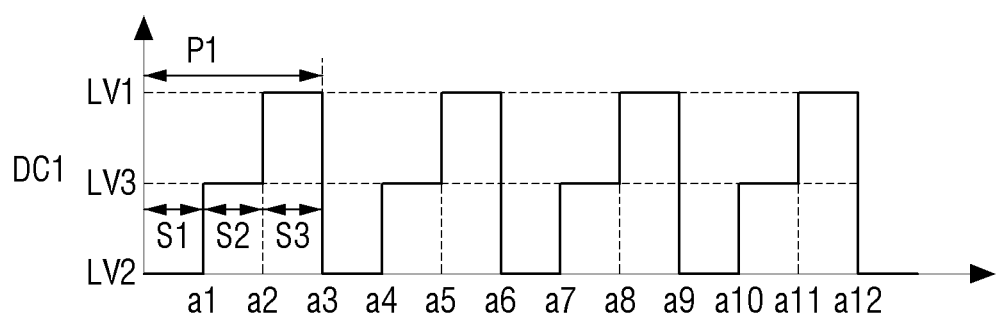

Referring to FIG. 6, the first DC pulse signal DC1 may have a first period P1. The first DC pulse signal DC1 may be repeated at a first period P1.

The first period P1 of the first DC pulse signal DC1 may include a first section S1, a second section S2 and a third section S3. The third section S3 may be subsequent to the second section S2. The third section S3 may include, for example, a section (e.g., period of time) from the second time point a2 to the third time point a3. Also, the third section S3 may include a section (e.g., period of time) from a fifth time point a5 to a sixth time point a6.

The first DC pulse signal DC1 may have the second level LV2 at the first section S1 (e.g., during the entire first section S1). The first DC pulse signal DC1 may have a third level LV3 at the second section S2 (e.g., during the entire second section S2). The first DC pulse signal DC1 may have a first level LV1 at the third section S3 (e.g., during the entire third section S3). The level of the first DC pulse signal DC1 may be kept constant at each of the first section S1, the second section S2, and the third section S3.

At the first time point a1, the level of the first DC pulse signal DC1 may change from the second level LV2 to the third level LV3. At the second time point a2, the level of the first DC pulse signal DC1 may change from the third level LV3 to the first level LV1. At the third time point a3, the level of the first DC pulse signal DC1 may change from the first level LV1 to the second level LV2. The changes may be nearly instantaneous, for example having a substantially vertical slope and having a duration only a minute fraction (e.g., 1% or less) of the duration of each of the first section S1, the second section S2, and the third section S3.

Each of the first section S1, the second section S2, and the third section S3 may be 0.1 seconds to 10 seconds. For example, each of the first section S1, the second section S2, and the third section S3 may be 0.5 seconds. The first DC pulse signal DC1 may be applied at the second level LV2 for 0.5 seconds during the first section S1. The first DC pulse signal DC1 may be applied at the third level LV3 for 0.5 seconds during the second section S2. The first DC pulse signal DC1 may be applied at the first level LV1 for 0.5 seconds during the third section S3.

Figure 7:
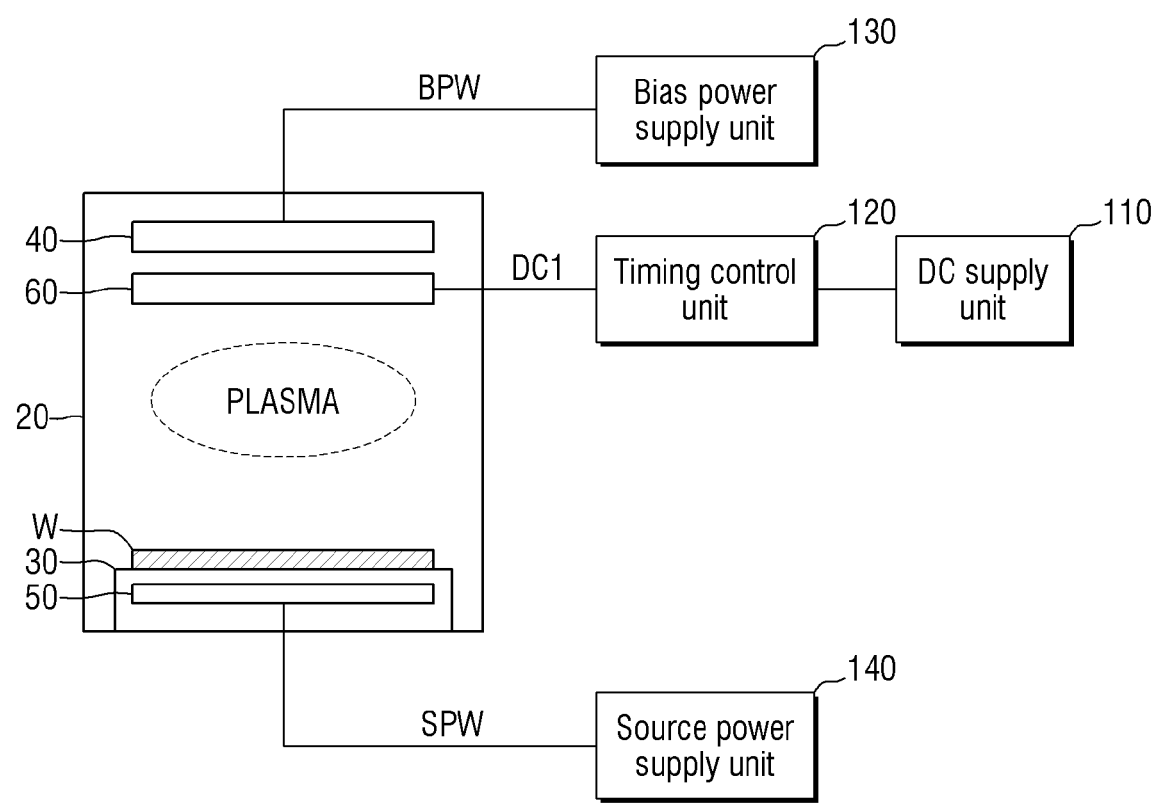
FIGS. 7 to 9 are diagrams for explaining a substrate processing device according to some other embodiments.
Figure 8:
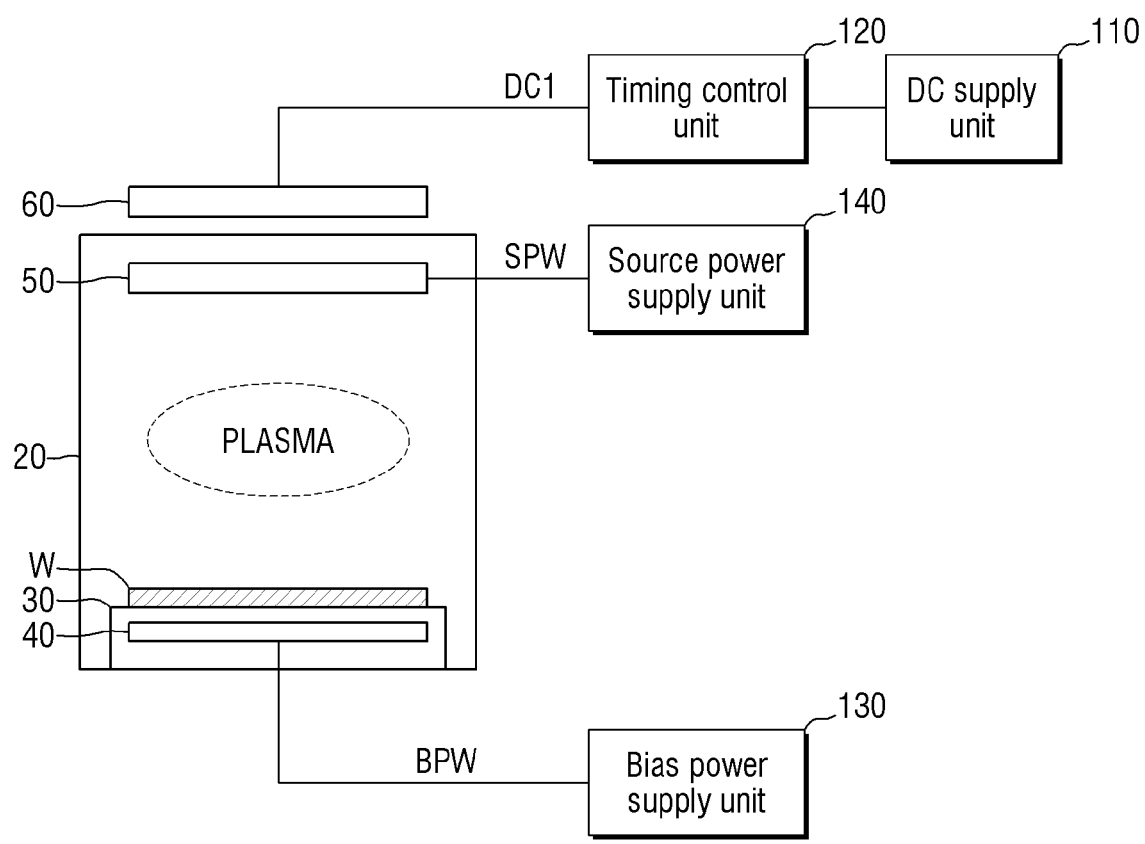
Figure 9:
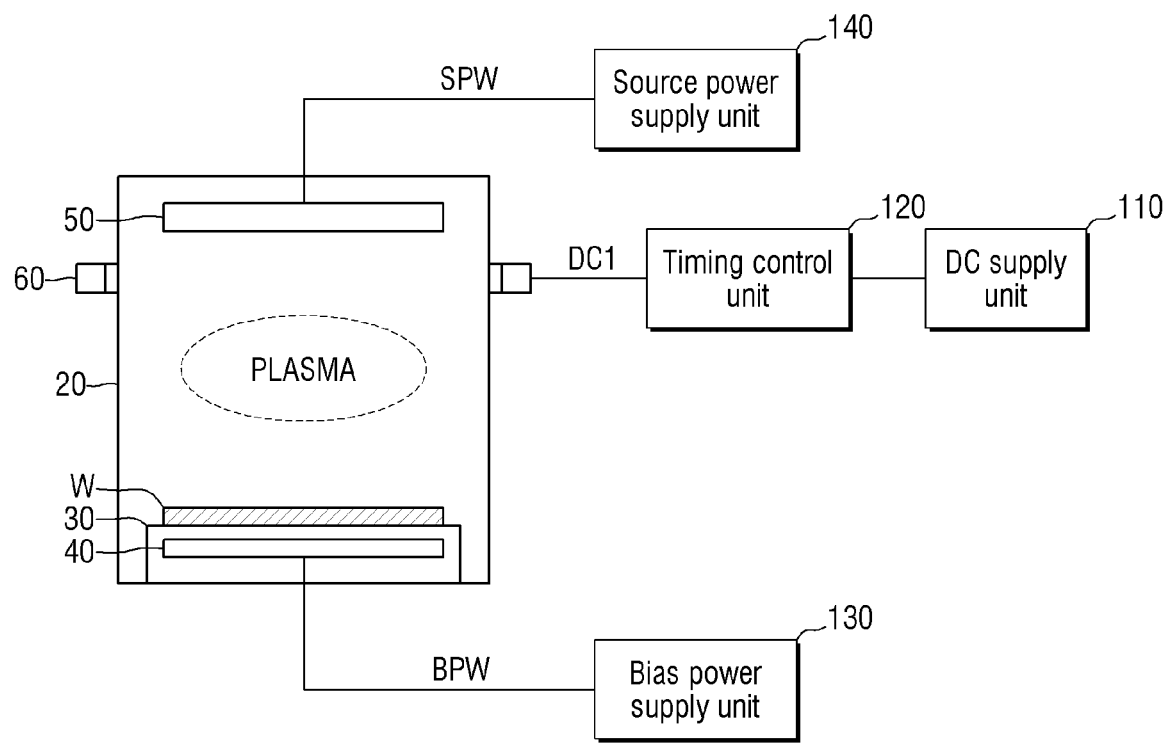

FIGS. 7 to 9 are diagrams for explaining a substrate processing device according to some other embodiments. For convenience of explanation, points different from those explained using FIG. 2 will be mainly explained.

Referring to FIG. 7, the bias power electrode 40 may be disposed at the upper part inside the process chamber 20. The bias power electrode 40 may be disposed on the substrate support 30. The source power electrode 50 may be disposed inside the substrate support 30. The source power electrode 50 may be disposed under the substrate W.

Although FIG. 7 shows that the bias power electrode 40 is disposed above the plasma distribution control electromagnet 60, the embodiments are not limited thereto. For example, the bias power electrode 40 may be disposed below the plasma distribution control electromagnet 60. The bias power electrode 40 may be disposed below the plasma distribution control electromagnet 60 on the substrate support 30, in an upper portion of the process chamber 20 above where the plasma is formed.

Referring to FIG. 8, the plasma distribution control electromagnet 60 may be disposed outside the process chamber 20. For example, the plasma distribution control electromagnet 60 may be disposed at the upper part of the process chamber 20. The plasma distribution control electromagnet 60 may be disposed above the outer upper surface of the process chamber 20.

Referring to FIG. 9, the plasma distribution control electromagnets 60 may be disposed on the outer side surface of the process chamber 20. For example, the plasma distribution control electromagnet 60 may have a circular annulus shape. The plasma distribution control electromagnet 60 may surround a part of the outer side surface of the process chamber 20.

Although FIG. 9 shows that the plasma distribution control electromagnet 60 is disposed below the source power electrode 50, embodiments are not limited thereto. For example, the plasma distribution control electromagnet 60 may be disposed to be higher than the source power electrode 50 with respect to the upper surface of the substrate support 30.

Figure 10:
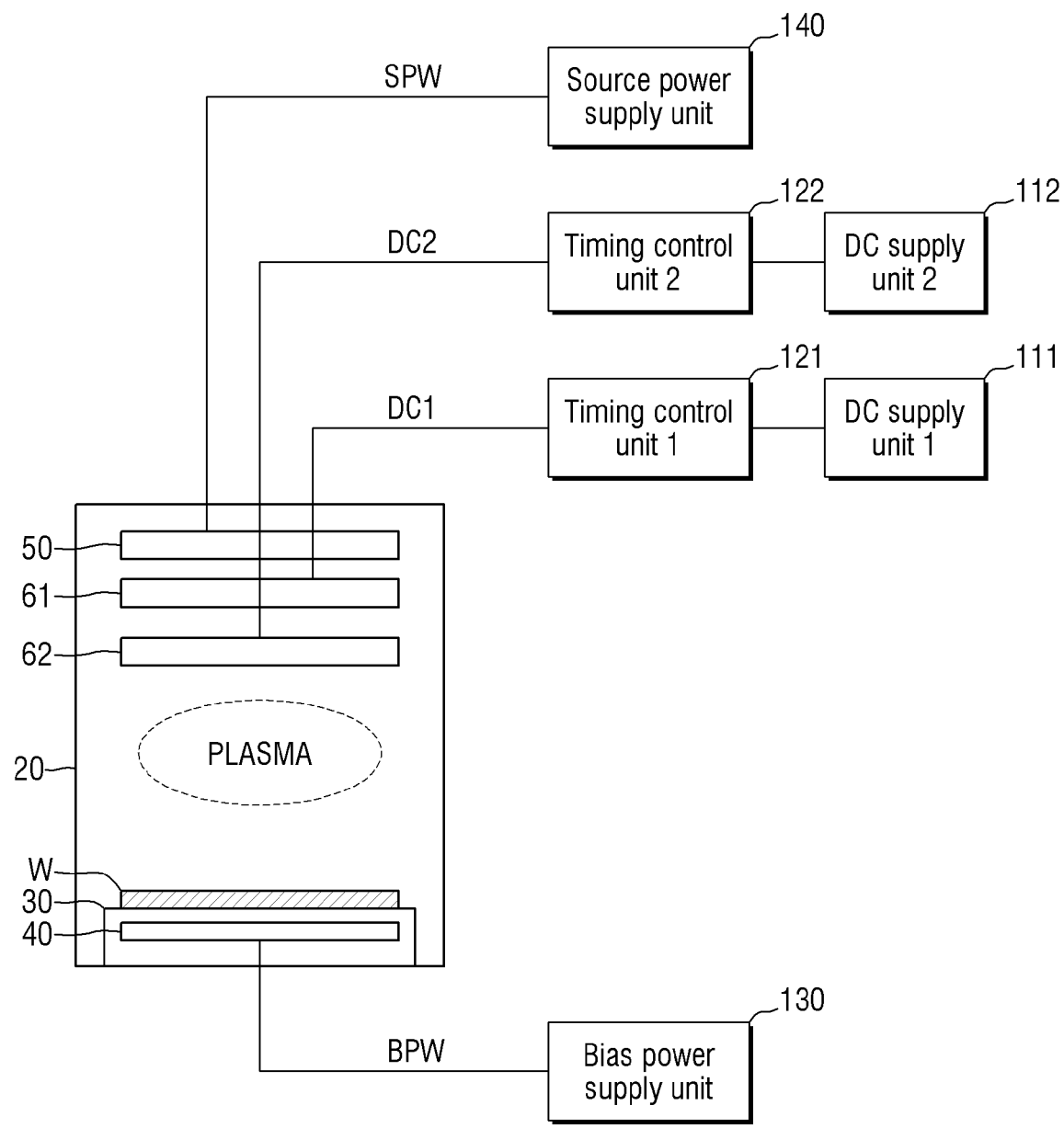
FIG. 10 is a diagram for explaining a substrate processing device according to some other embodiments.

FIG. 10 is a diagram for explaining a substrate processing device according to some other embodiments. For convenience of explanation, points different from those explained using FIG. 2 will be mainly explained Referring to FIG. 10, the substrate processing device according to some embodiments may include a first plasma distribution control electromagnet 61 and a second plasma distribution control electromagnet 62. Each electromagnet may include a plurality of electromagnetic coils, each connected to a DC power source (e.g., a common power source or separate power sources). The first plasma distribution control electromagnet 61 and the second plasma distribution control electromagnet 62 may comprise solenoids.

The first plasma distribution control electromagnet 61 and the second plasma distribution control electromagnet 62 may be disposed at the upper part inside the process chamber 20. The first plasma distribution control electromagnet 61 and the second plasma distribution control electromagnet 62 may be disposed above the substrate support 30.

The first plasma distribution control electromagnet 61 may be electrically connected to the first DC supply unit 111.

The first plasma distribution control electromagnet 61 may be provided with the first DC pulse signal DC1. The first plasma distribution control electromagnet 61 may be provided with the first DC pulse signal DC1 through the first DC supply unit 111 and the first timing control unit 121. The second plasma distribution control electromagnet 62 may be electrically connected to the second DC supply unit 112. The second plasma distribution control electromagnet 62 may be provided with the second DC pulse signal DC2. The second plasma distribution control electromagnet 62 may be provided with the second DC pulse signal DC2 through the second timing control unit 122 and the second DC supply unit 112. Providing the first DC pulse signal DC1 to the first plasma distribution control electromagnet 61 may include providing the first DC pulse signal DC1 to the first plasma distribution control electromagnet 61 in a first direction, and providing the second DC pulse signal DC2 to the second plasma distribution control electromagnet 62 may include providing the second DC pulse signal DC2 to the second plasma distribution control electromagnet 62 in the same, first direction or in a second direction opposite the first direction.

The first timing control unit 121 may control the time of each section of the first DC pulse signal DC1. For example, the first timing control unit 121 may control the timing at which the level of the first DC pulse signal DC1 changes. The second timing control unit 122 may control the time of each section of the second DC pulse signal DC2. The second timing control unit 122 may control the time point at which the level of the second DC pulse signal DC2 changes. The first timing control unit 121 and second timing control unit 122 can provide independent control of the first and second plasma distribution control electromagnets 61 and 62.

Although FIG. 10 shows that the first plasma distribution control electromagnet 61 and the second plasma distribution control electromagnet 62 are disposed at the upper part of the process chamber 20, the embodiments are not limited thereto. Although FIG. 10 shows that the first plasma distribution control electromagnet 61 and the second plasma distribution control electromagnet 62 overlap each other (e.g., in a vertical direction), the embodiments are not limited thereto. For example, in some embodiments, the first plasma distribution control electromagnet 61 and the second plasma distribution control electromagnet 62 do not overlap each other, and may be disposed to face each other on the inner wall of the process chamber 20.

Figure 11:
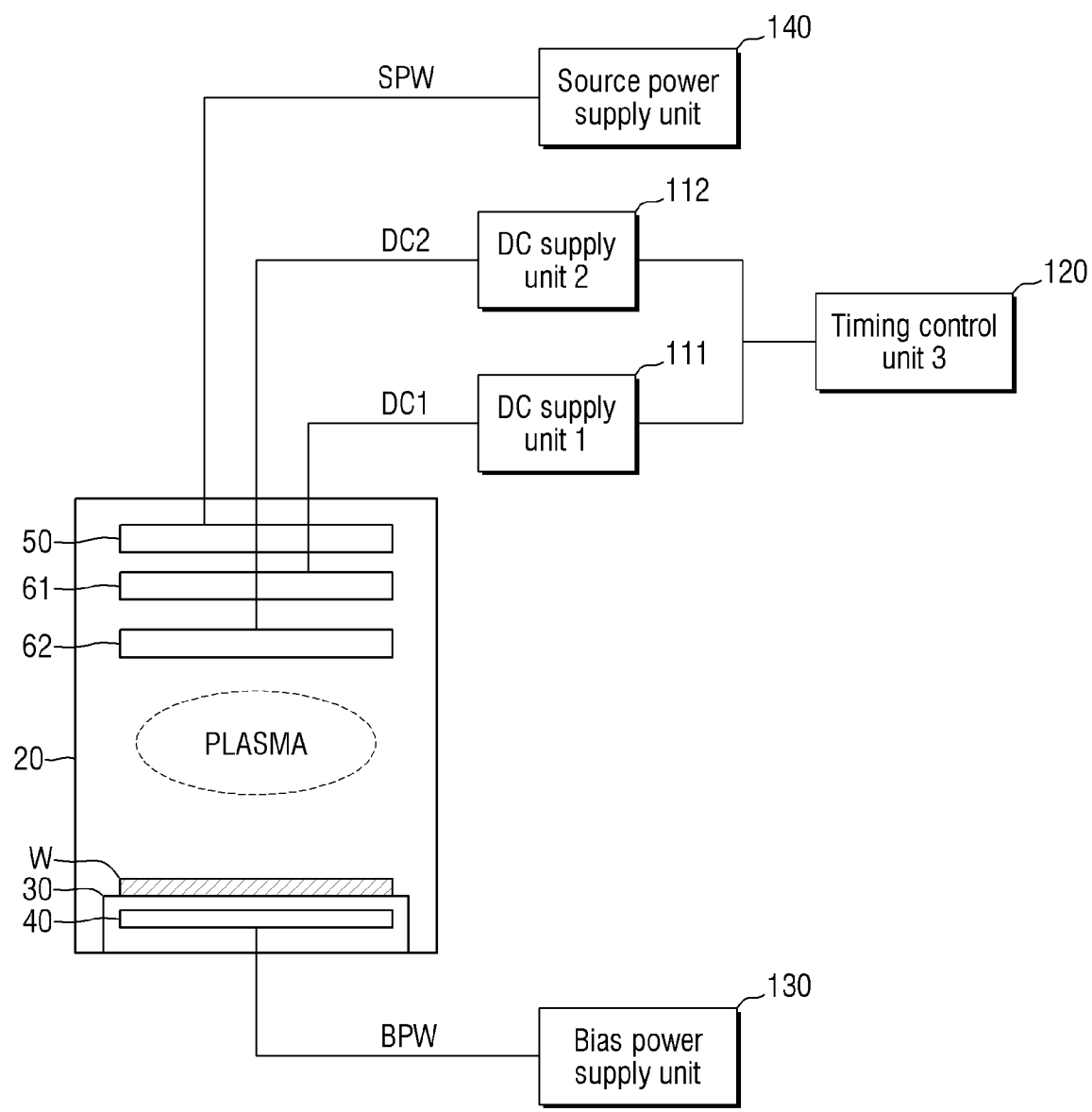
FIG. 11 is a diagram for explaining a substrate processing device according to some other embodiments.

FIG. 11 is a diagram for explaining a substrate processing device according to some other embodiments. For convenience of explanation, points different from those explained using FIG. 10 will be mainly explained.

Referring to FIG. 11, the timing control unit 120 may control the times of each section of the first DC pulse signal DC1 and the second DC pulse signal DC2. For example, the timing control unit 120 may control the time of the section of the first DC pulse signal DC1 supplied by the first DC supply unit 111. The timing control unit 120 may control the time point at which the level of the first DC pulse signal DC1 changes. The timing control unit 120 may control the time of the section of the second DC pulse signal DC2 supplied by the second DC supply unit 112. The timing control unit 120 may control the time point at which the level of the second DC pulse signal DC2 changes. Generally, a timing control unit, timing controller, or timing control circuit as described herein may refer to the timing control unit 3 of FIG. 11, or the combined timing control units 1 and 2 of FIG. 10.

FIGS. 12 to 16 are timing charts for explaining DC pulse signals.

Figure 12:
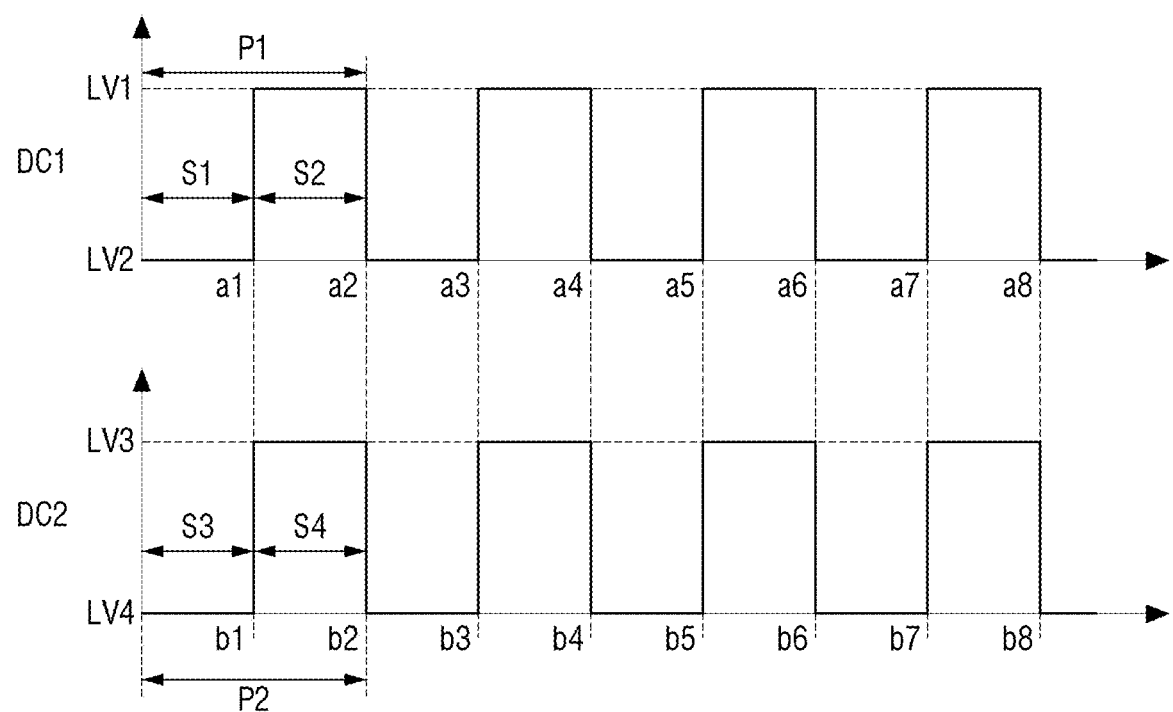
FIGS. 12 to 16 are timing charts for explaining a DC pulse signal.

Referring to FIGS. 10 and 12, the first DC pulse signal DC1 and the second DC pulse signal DC2 may coincide.

The first DC pulse signal DC1 may have a first period P1. The first DC pulse signal DC1 may be repeated at the first period P1. The first period P1 of the first DC pulse signal DC1 may include a first section S1 and a second section S2. The first section S1 may include, for example, a section from the start time point to the first time point a1. The first section S1 may include a section from the second time point a2 to the third time point a3. Also, the second section S2 may include, for example, a section from the first time point a1 to the second time point a2. The second section S2 may include a section from the third time point a3 to the fourth time point a4.

The first DC pulse signal DC1 may have a second level LV2 during the first section S1, which may be constant throughout the first section S1. The first DC pulse signal DC1 may have a first level LV1 during the second section S2, which may be constant throughout the second section S2.

The second DC pulse signal DC2 may have a second period P2. The second DC pulse signal DC2 may be repeated at the second period P2. The second period P2 of the second DC pulse signal DC2 may include a third section S3 and a fourth section S4. The third section S3 may include, for example, a section from the start time point to a ninth time point b1. The third section S3 may include a section from a tenth time point b2 to an eleventh time point b3. Also, the fourth section S4 may include, for example, a section from the ninth time point b1 to the tenth time point b2. The fourth section S4 may include a section from the eleventh time point b3 to a twelfth time point b4.

The second DC pulse signal DC2 may have a fourth level LV4 during the third section S3, which may be constant throughout the third section S3. The second DC pulse signal DC2 may have a third level LV3 during the fourth section S4, which may be constant throughout the fourth section S4.

The first section S1 and the third section S3 may coincide. For example, the start time point of the first section S1 and the start time point of the third section S3 may be the same time point. The end time point of the first section S1 and the end time point of the third section S3 may be the same time point. For example, the second time point a2, which is the start time point of the first section S1, may be the same time point as the tenth time point b2, which is the start time point of the third section S3.

The second section S2 and the fourth section S4 may coincide. For example, the start time point of the second section S2 may be the same time point as the start time point of the fourth section S4. The end time point of the second section S2 may be the same time point as the end time point of the fourth section S4. For example, the first time point a1, which is the start time point of the second section S2, may be the same time point as the ninth time point b1, which is the start time point of the fourth section S4.

The first level LV1 of the first DC pulse signal DC1 may be the same as the third level LV3 of the second DC pulse signal DC2 (e.g., the same voltage level). The second level LV2 of the first DC pulse signal DC1 may be the same as the fourth level LV4 of the second DC pulse signal DC2 (e.g., the same voltage level). Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

The first section S1 and the second section S2 of the first DC pulse signal DC1, and the third section S3 and the fourth section S4 of the second DC pulse signal DC2 may have the same durations as each other in some embodiments, and may each be, for example from 0.1 seconds to 10 seconds.

Figure 13:
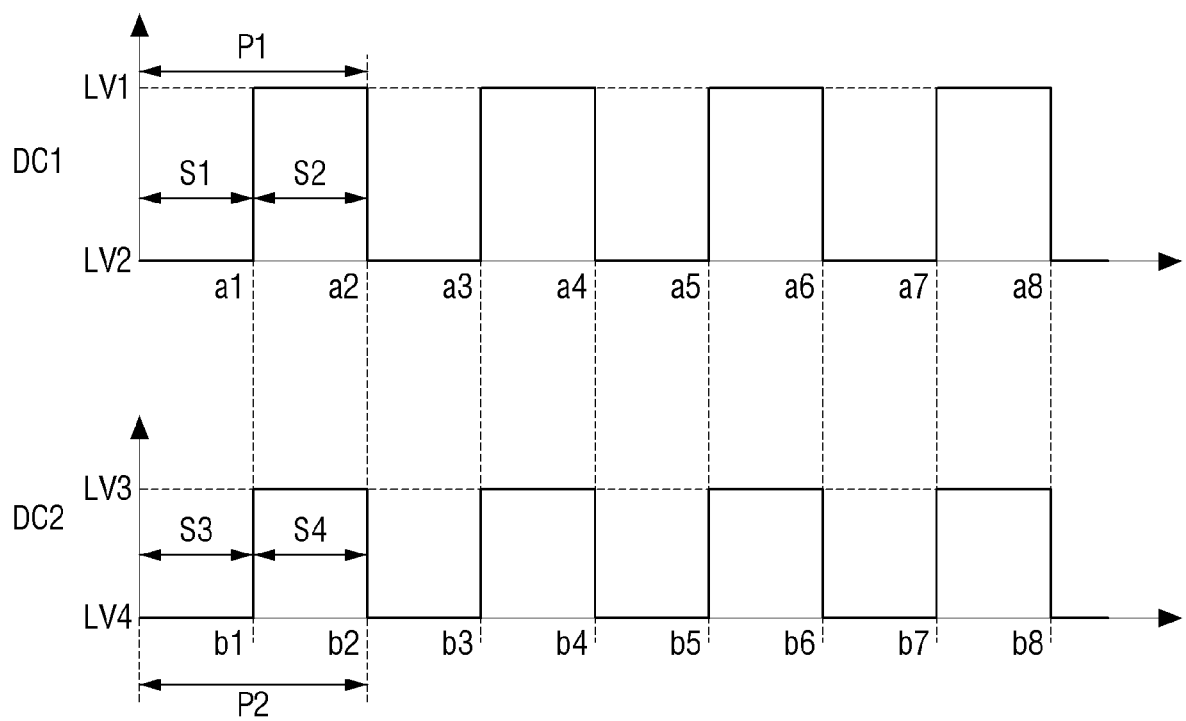

Referring to FIG. 13, in one embodiment, the first level LV1 and the third level LV3 may differ from each other. For example, the third level LV3 of the second DC pulse signal DC2 may be lower (e.g., a lower voltage) than the first level LV1 of the first DC pulse signal DC1.

Although FIG. 13 shows that the second level LV2 and the fourth level LV4 are the same, the embodiments are not limited thereto. For example, the second level LV2 of the first DC pulse signal DC1 and the fourth level LV4 of the second DC pulse signal DC2 may also be different from each other.

Figure 14:
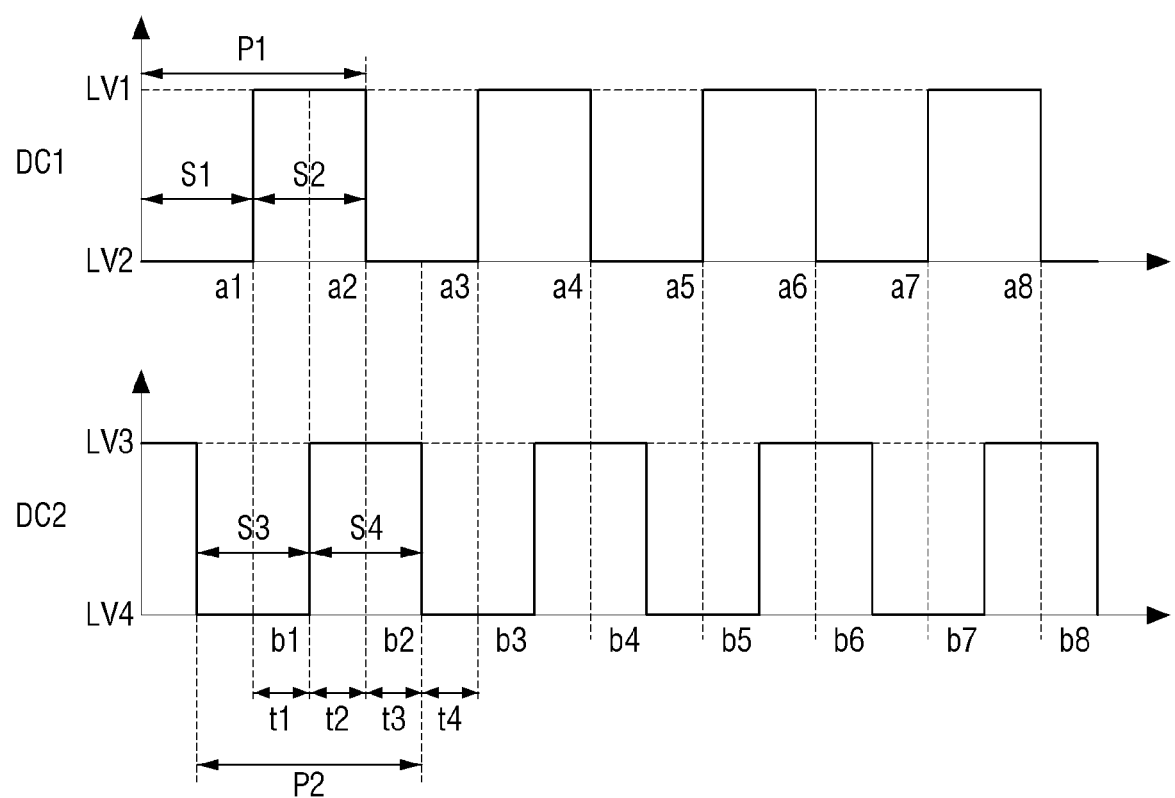

Referring to FIG. 14, the first DC pulse signal DC1 and the second DC pulse signal DC2 may have the same period, but different phases.

Specifically, the first section S1 of the first DC pulse signal DC1 and the third section S3 of the second DC pulse signal DC2 may not fully overlap. The second section S2 of the first DC pulse signal DC1 and the fourth section S4 of the second DC pulse signal DC2 may not fully overlap. For example, the start time point of the first section S1 may differ from the start time point of the third section S3 and the end time point of the first section S1 may differ from the end time point of the third section S3. The start time point of the second section S2 may be different from the start time point of the fourth section S4, and the end time point of the second section S2 may be different from the end time point of the fourth section S4.

The level of the first DC pulse signal DC1 may change from the second level LV2 to the first level LV1 at the first time point a1. After the level of the first DC pulse signal DC1 changes, for the next level change of the second DC pulse signal DC2, the level of the second DC pulse signal DC2 may subsequently change at the ninth time point b1. The second DC pulse signal DC2 may change from the fourth level LV4 to the third level LV3 at the ninth time point b1. A time difference between the first time point a1 and the ninth time point b1 may be a first time t1. In one embodiment, the first time t1 may be 0.1 seconds to 10 seconds. For example, the first time t1 may be 0.1 seconds.

After the level of the second DC pulse signal DC2 changes at the ninth time point b1, for the next level change of the first DC pulse signal DC1, the level of the first DC pulse signal DC1 may subsequently change at the second time point a2. The first DC pulse signal DC1 may change from the first level LV1 to the second level LV2 at the second time point a2. A time difference between the ninth time point b 1 and the second time point a2 may be a second time t2. For example, the second time t2 may be 0.1 seconds to 10 seconds. For example, the second time t2 may be 0.1 seconds.

Similarly, after the level of the first DC pulse signal DC1 changes at the second time point a2, the level of the second DC pulse signal DC2 may subsequently change at the tenth time point b2. The second DC pulse signal DC2 may change from the third level LV3 to the fourth level LV4 at the tenth time point b2. A time difference between the second time point a2 and the tenth time point b2 may be a third time t3. At this time, the third time t3 may be 0.1 seconds to 10 seconds.

After the level of the second DC pulse signal DC2 changes at the tenth time point b2, the level of the first DC pulse signal DC1 may subsequently change at the third time point a3. The first DC pulse signal DC1 may change from the second level LV2 to the first level LV1 at the third time point a3. A time difference between the tenth time point b2 and the third time point a3 may be a fourth time t4. For example, the fourth time t4 may be 0.1 to 10 seconds. In the example of FIG. 14, the first DC pulse signal DC1 and the second DC pulse signal DC2 are shown to have the same period and the same duty ratio, but are out of phase by a particular amount (e.g., between 0.1 and 10 seconds). However, the embodiments are not limited to this example.

Figure 15:
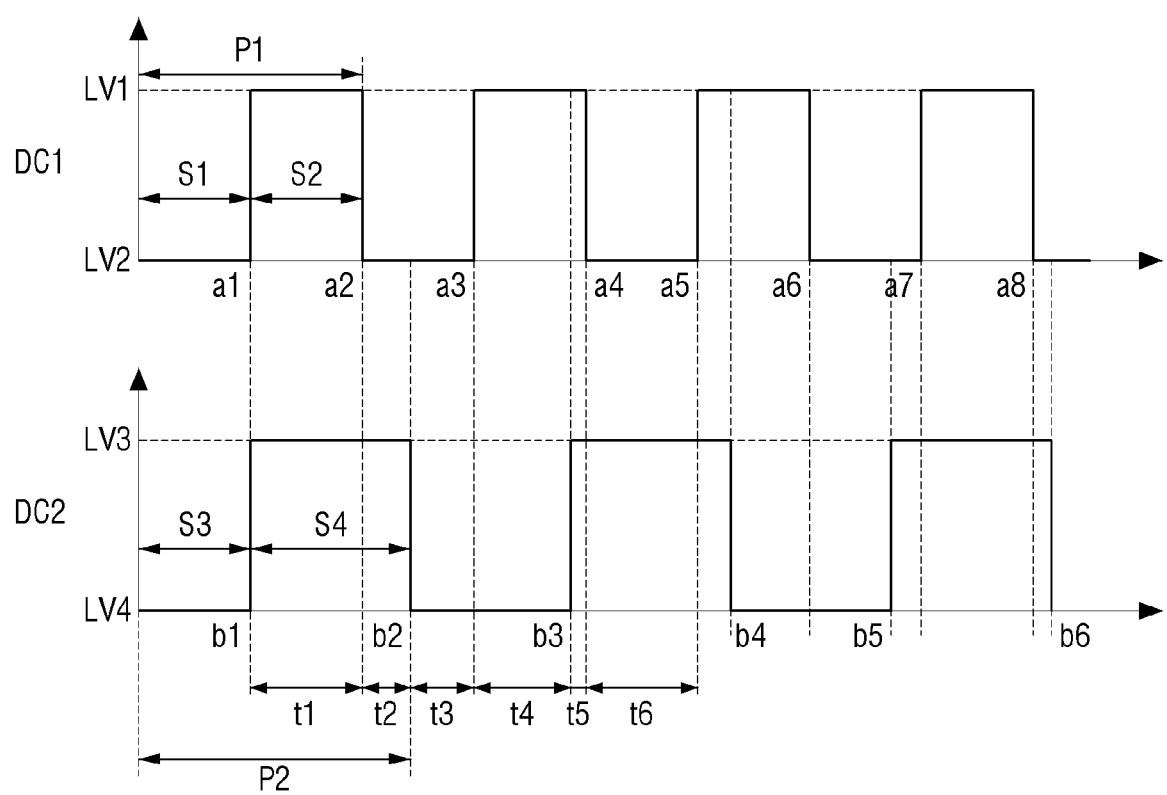

Referring to FIG. 15, the first DC pulse signal DC1 and the second DC pulse signal DC2 may have different periods. The first period P1 of the first DC pulse signal DC1 may not coincide with the second period P2 of the second DC pulse signal DC2. For example, the first period P1 of the first DC pulse signal DC1 may be shorter than the second period P2 of the second DC pulse signal DC2.

After the level of either one of the first DC pulse signal DC1 and the second DC pulse signal DC2 changes, the time difference until the level of one of the signals subsequently changes may be 0.1 seconds to 10 seconds.

For example, the level of the first DC pulse signal DC1 may change from the first level LV1 to the second level LV2 at the second time point a2. After that, the level of the second DC pulse signal DC2 may subsequently change from the third level LV3 to the fourth level LV4 at the tenth time point b2. At this time, the second time t2 between the second time point a2 and the tenth time point b2 may be 0.1 seconds to 10 seconds.

As another example, the level of the second DC pulse signal DC2 may change from the fourth level LV4 to the third level LV3 at the eleventh time point b3. After that, the level of the first DC pulse signal DC1 may subsequently change from the first level LV1 to the second level LV2 at the fourth time point a4. At this time, a fifth time t5 between the eleventh time point b3 and the fourth time point a4 may be 0.1 seconds to 10 seconds.

As still another example, after the level of the first DC pulse signal DC1 changes, the level of the first DC pulse signal DC1 may change again, before the level of the second DC pulse signal DC2 changes.

Specifically, after the level of the first DC pulse signal DC1 changes from the first level LV1 to the second level LV2 at the fourth time point a4, the level of the first DC pulse signal DC1 may change again from the second level LV2 to the first level LV1 at the fifth time point a5. At this time, the level of the second DC pulse signal DC2 may be kept constant without changing, between the fourth time point a4 and the fifth time point a5. Also in this case, the sixth time t6 between the fourth time point a4 and the fifth time point a5 may be 0.1 seconds to 10 seconds.

Figure 16:
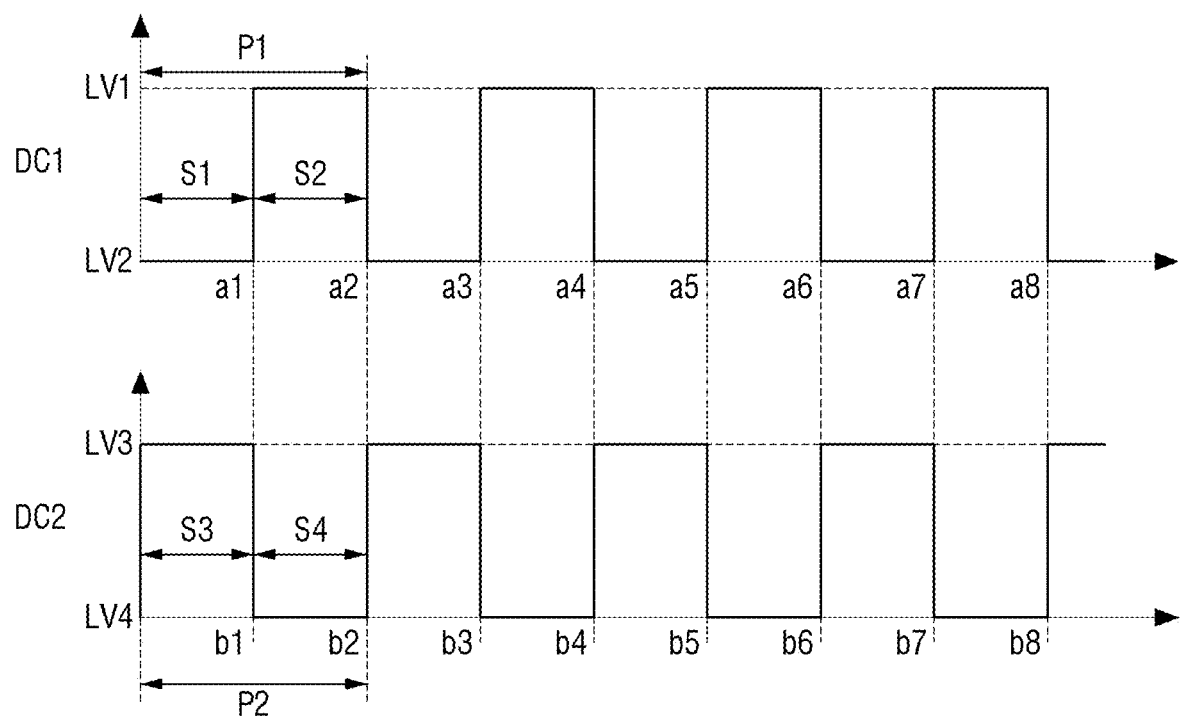

Referring to FIG. 16, the phases of the first DC pulse signal DC1 and the second DC pulse signal DC2 may differ. Specifically, the phases of the first DC pulse signal DC1 and the second DC pulse signal DC2 may be completely opposite to each other (e.g., 180 degrees out of phase).

The time of the first period P1 of the first DC pulse signal DC1 may coincide with the time of the second period P2 of the second DC pulse signal DC2. During the same section, the level of the first DC pulse signal DC1 and the level of the second DC pulse signal DC2 may differ.

The first section S1 of the first DC pulse signal DC1 may coincide with the third section S3 of the second DC pulse signal DC2. The start time point and the end time point of the first section S1 may coincide with the start time point and the end time point of the third section S3. The second section S2 of the first DC pulse signal DC1 may coincide with the fourth section S4 of the second DC pulse signal DC2. The start time point and the end time point of the second section S2 may coincide with the start time point and the end time point of the fourth section S4.

At the first DC pulse signal DC1 may have a second level LV2 at the first section S1. The second DC pulse signal DC2 may have a third level LV3 at the third section S3. The levels of the first DC pulse signal DC1 and the second DC pulse signal DC2 may be different during the time at which the first section S1 and the third section S3 coincide with each other.

The first DC pulse signal DC1 may have a first level LV1 at the second section S2. The second DC pulse signal DC2 may have a fourth level LV4 at the fourth section S4. The levels of the first DC pulse signal DC1 and the second DC pulse signal DC2 may be different during the time at which the second section S2 and the third section S3 coincide with each other.

The first level LV1 of the first DC pulse signal DC1 may be equal to the third level LV3 of the second DC pulse signal DC2. The second level LV2 of the first DC pulse signal DC1 may be equal to the fourth level LV4 of the second DC pulse signal DC2.

Each of the first section S1, the second section S2, the third section S3 and the fourth section S4 may be 0.1 seconds to 10 seconds.

Figure 17:
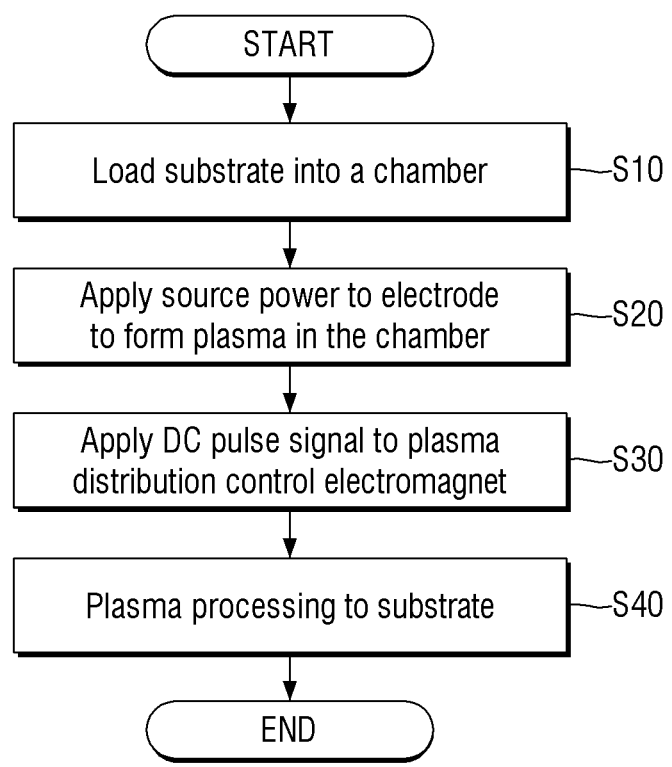
FIG. 17 is a flow chart for explaining a substrate processing method according to some embodiments.

FIG. 17 is a flow chart for explaining a substrate processing method according to some embodiments. FIGS. 18 to 21 are diagrams for explaining the substrate processing method according to some embodiments.

Figure 18:
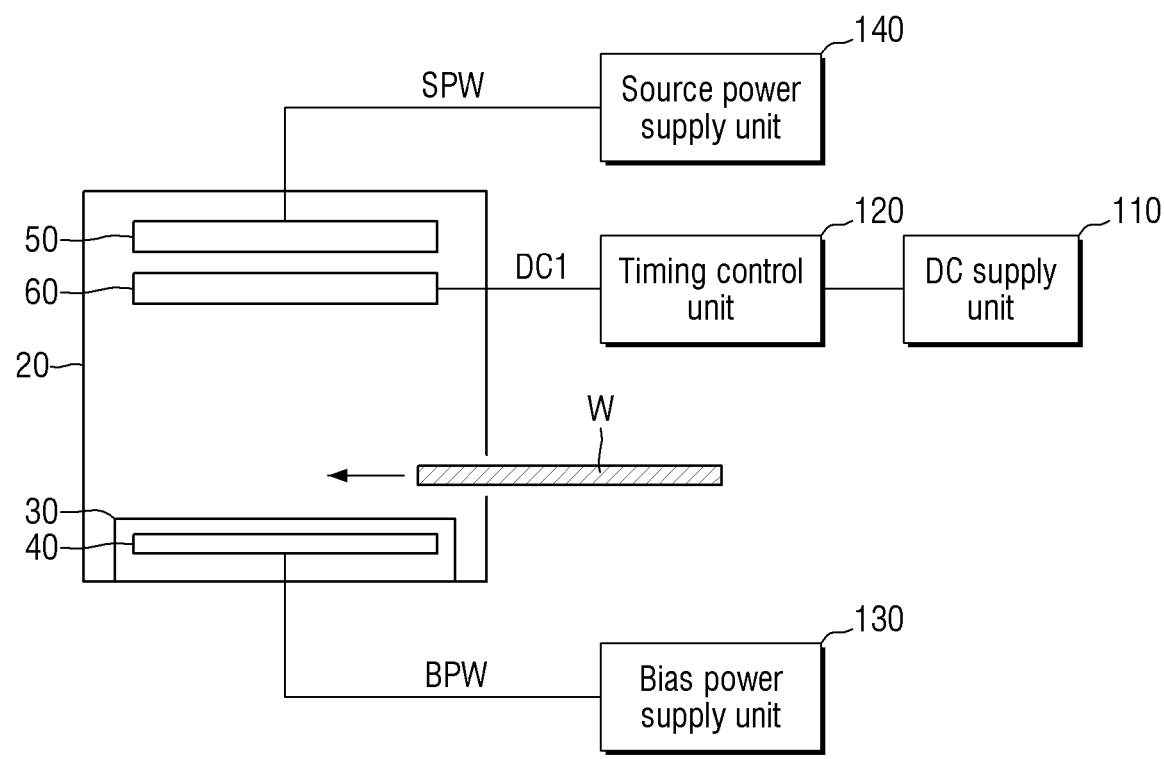
FIGS. 18 to 21 are diagrams for explaining the substrate processing method according to some embodiments.

Referring to FIGS. 17 and 18, the substrate W is loaded into the process chamber 20 (S10).

Although it is not shown in FIG. 18, the substrate W may be provided into the process chamber 20 through a door disposed on one side of the process chamber 20. The substrate W may be put on the substrate support 30 of the process chamber 20.

Figure 19:
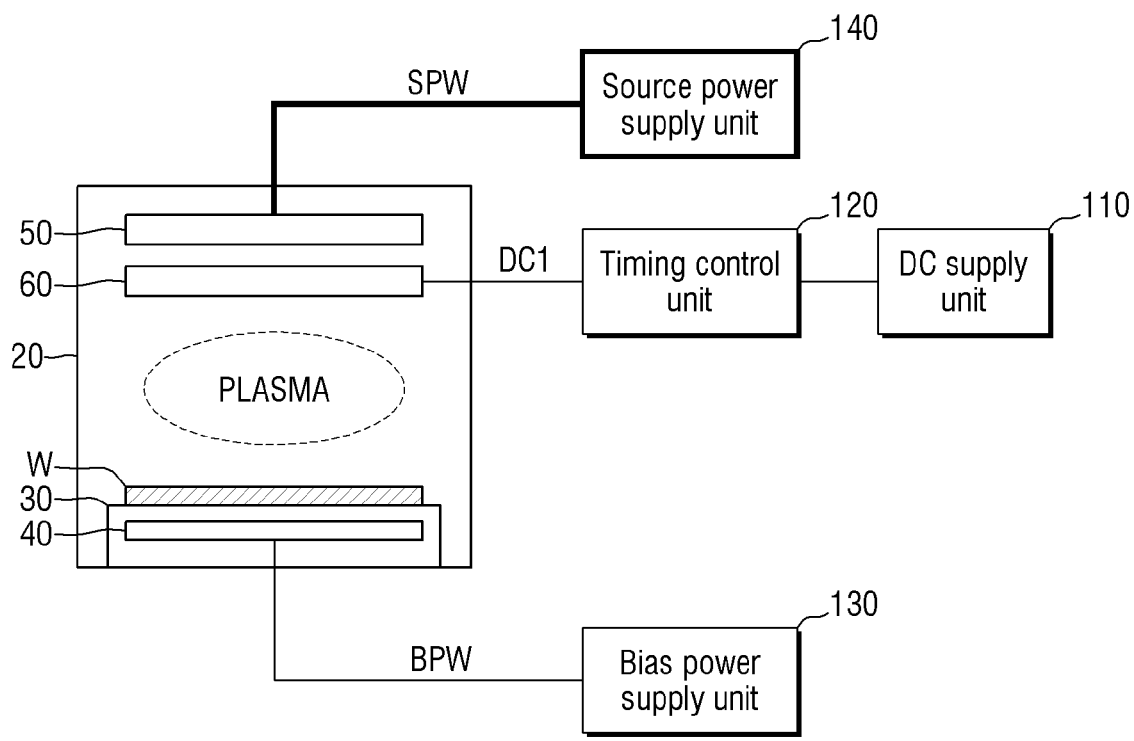

Next, referring to FIGS. 17 and 19, a source power signal is applied to the electrode to form a plasma (S20).

Specifically, a source power signal SPW may be provided to the source power electrode 50 through the source power supply unit 140.

When the source power signal SPW is applied to the source power electrode 50, a magnetic field may be formed. Accordingly, plasma may be formed in the process chamber 20. For example, a source gas for forming the plasma inside the process chamber 20 may be provided. The source power electrode 50 provided with the source power signal SPW may form the plasma inside the process chamber 20, using the source gas.

The plasma may be formed inside the process chamber 20, when the source power signal SPW is applied to the source power electrode 50. At this time, the distribution of plasma may not be constant for the substrate W. For example, a relatively large amount of plasma may be formed on a central part of the substrate W, and a relatively small amount of plasma may be formed on an edge part of the substrate W. In another example, a relatively small amount of plasma may be formed on the central part of the substrate W, and a relatively large amount of plasma may be formed on the edge part of the substrate W.

Figure 20:
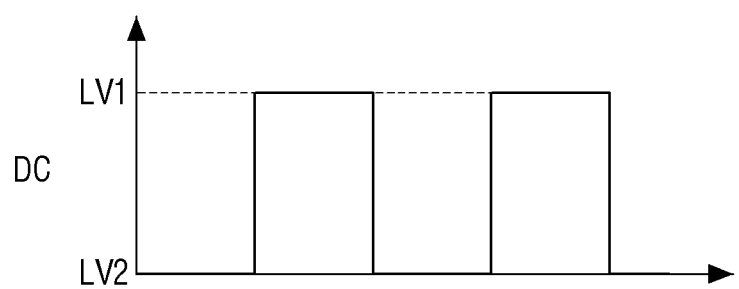
Figure 20:
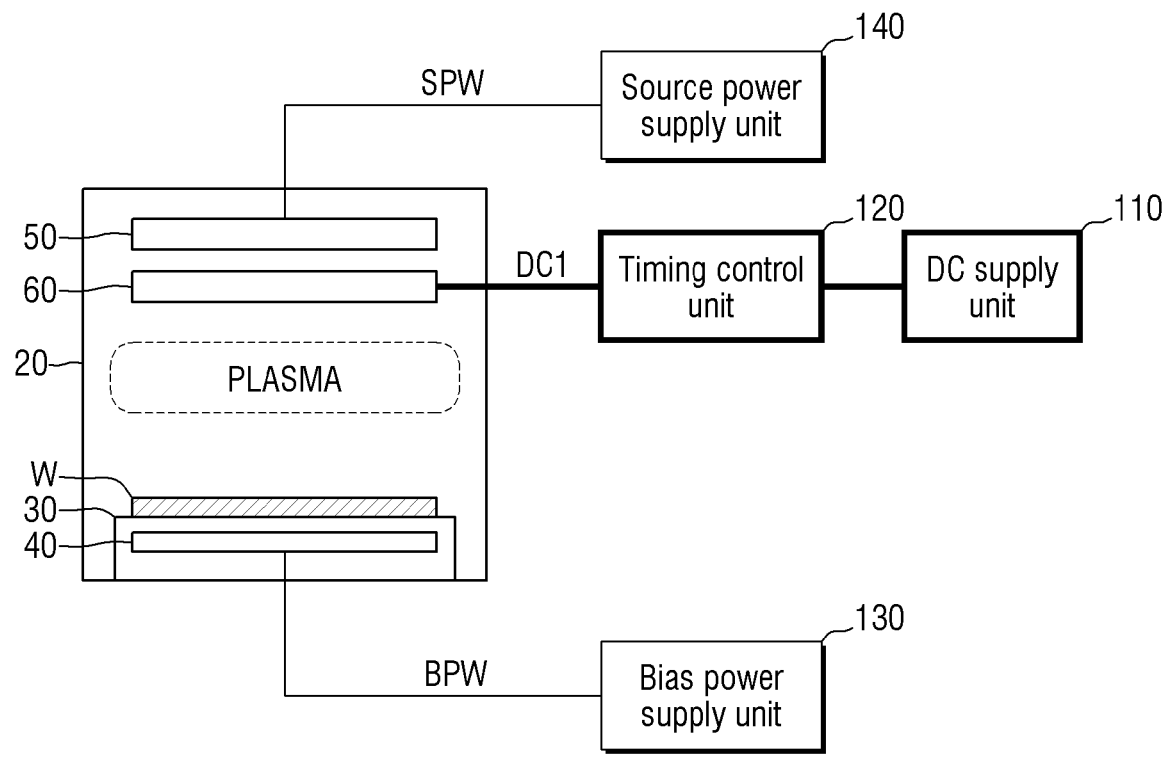

Next, referring to FIGS. 17 and 20, a DC pulse signal is applied to the electromagnet (S30).

Specifically, the first DC pulse signal DC may be provided to the plasma distribution control electromagnet 60 through the DC supply unit 110 and the timing control unit 120. The first DC pulse signal DC may be, for example, a signal whose level changes between the first level LV1 and the second level LV2 and is applied alternately.

When the first DC pulse signal DC is applied to the plasma distribution control electromagnet 60, the plasma may be redistributed inside the process chamber 20. The plasma distribution control electromagnet 60 may generate a magnetic field inside the process chamber 20. Specifically, when the first DC pulse signal DC is applied to the plasma distribution control electromagnet 60, a magnetic field may be formed inside the process chamber 20. The plasma in the process chamber 20 may be redistributed in accordance with the influence of the magnetic field generated by the plasma distribution control electromagnet 60 supplied with the first DC pulse signal DC. For example, the distribution of plasma may be redistributed to be relatively uniform over the central part and the edge part of the substrate W.

Intensity of the magnetic field formed by applying the first DC pulse signal DC to the plasma distribution control electromagnet 60 may be several gauss (G) to several tens of gauss (G). Though shown in sequence, step S20 and S30 may occur at the same time, or step S30 may occur prior to step S20. Also, the first DC pulse signal DC applied can be a signal having the form of any of the pulse signal examples of FIGS. 3-6. Also, though a single DC pulse signal DC is shown to be applied by a single plasma distribution control electromagnet 60, in some embodiments, two DC pulse signals such as depicted any one of FIGS. 12-16 may be applied using two plasma distribution control electromagnets, which in some embodiments can be independently controlled, such as depicted in any of FIGS. 10 and 11.

Figure 21:
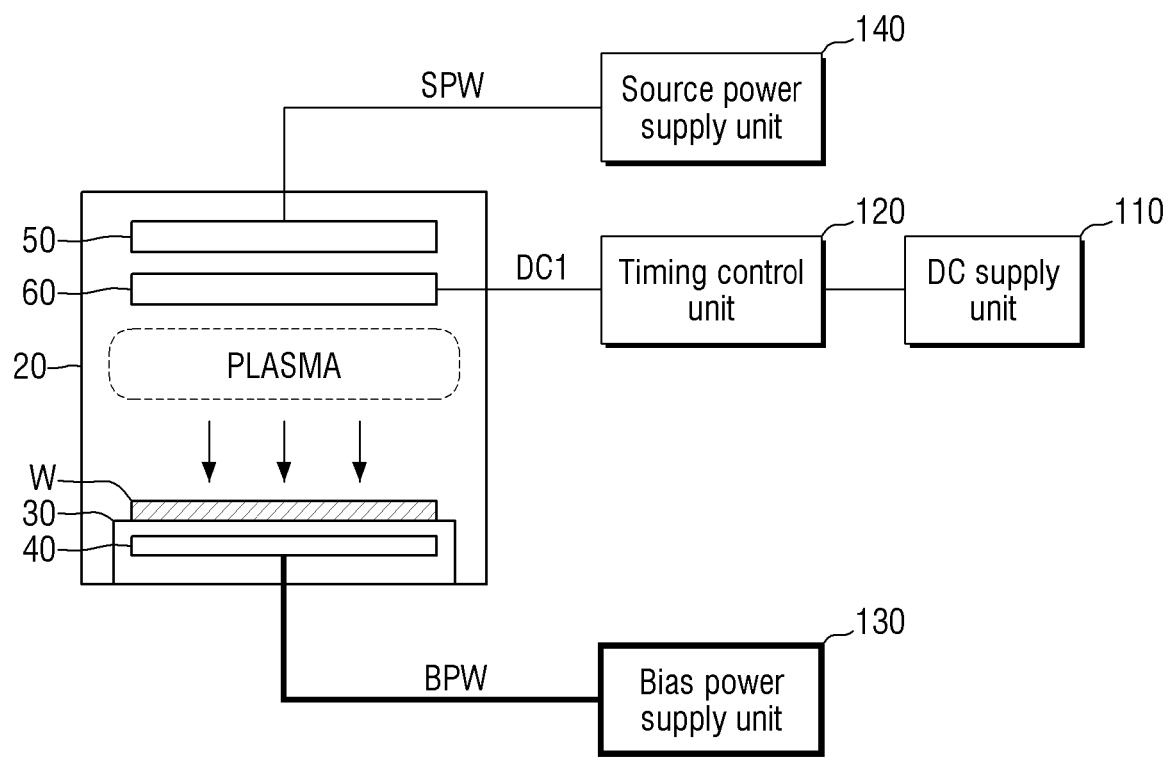

Next, referring to FIGS. 17 and 21, a process using plasma is performed on the substrate (S40).

A bias power signal BPW may be provided from the bias power supply unit 130 to the bias power electrode 40. The bias power signal BPW may include, for example, an RF power signal. That is, the bias power signal BPW may include an AC signal. The plasma formed inside the process chamber 20 may be induced onto the substrate W, when the bias power signal BPW is provided to the bias power electrode 40.

The substrate W may be subjected to, for example, an etching process using the plasma.

By using one or more DC pulse signals, particularly having a duration between about 0.1 seconds and 10 seconds, experimentation has shown that the distribution of plasma becomes more uniform during substrate processing. In addition, when using two or more electromagnets (e.g., coils), a desired type of magnetic field can be formed by applying current synchronously, asynchronously, phase shifted, or arbitrarily through the electromagnet circuits, and each DC level can be driven for different times. The timing control unit can also be used to control the duty cycle of the DC pulse signals. Through the control of these signal components, it is possible to control the linearity of the response between the magnetic field and the plasma distribution, as well as to control the applied current value and the strength of the induced magnetic field.

Figure 22:
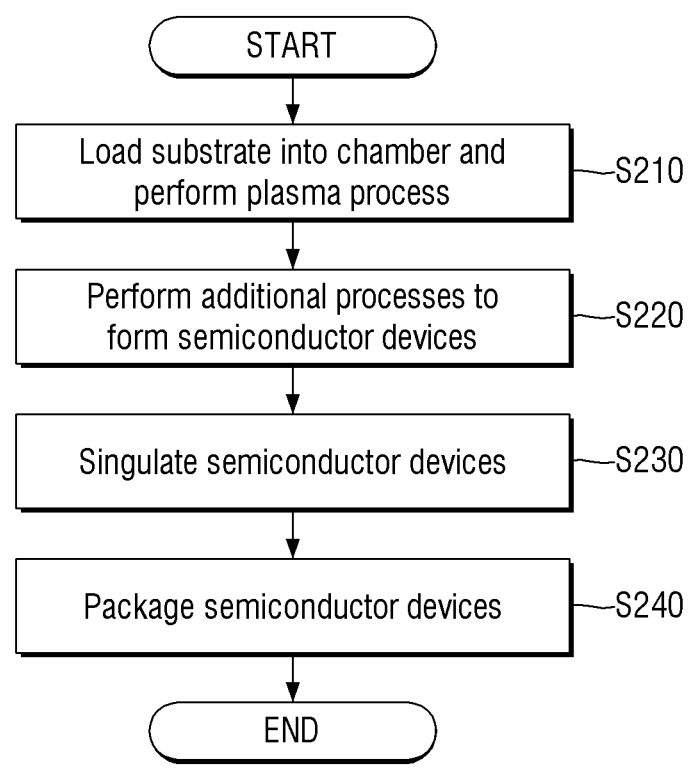
FIG. 22 is a flow chart for explaining a method of manufacturing a semiconductor device according to example embodiments.

FIG. 22 is a flow chart for explaining a method of manufacturing a semiconductor device according to example embodiments. A semiconductor device may be, for example, a semiconductor chip including an integrated circuit formed on a die, which may be a memory chip, logic chip, or a processor chip. The semiconductor device may also be a semiconductor package including a package substrate, one or more semiconductor chips formed on the package, and an encapsulant covering the package substrate and the one or more semiconductor chips. A semiconductor device may also be a display device such as an image pixel or image pixel array.

As one example, in step S210, a substrate is loaded into a chamber, and a first plasma process is performed. For example, the steps in FIG. 17 may be performed. In step S220, one or more additional processes are performed on the substrate. The additional processes may include additional plasma processes and/or additional non-plasma processes. The processes may include, for example, deposition, patterning, etching, ashing, ion implantation, thin film deposition, coating, and/or cleaning, to form a plurality of layers that form a semiconductor device such as a semiconductor chip or image sensor chip on the substrate. In step S230, the semiconductor devices may be singulated from the substrate to form individual semiconductor devices. In step S240, the semiconductor devices may be packaged, for example, into a semiconductor package or image sensor array.

In concluding the detailed description, those skilled in the art will appreciate that many variations and modifications may be made to the various embodiments without substantially departing from the principles of the present invention. Therefore, the disclosed embodiments of the invention are used in a generic and descriptive sense only and not for purposes of limitation.

What is claimed is:

1. A method of manufacturing a semiconductor device, comprising:
    loading a substrate onto a substrate support inside a chamber;
    forming a plasma inside the chamber;
    providing a first DC pulse signal to an electromagnet that generates a magnetic field inside the chamber; and
    processing the substrate with the plasma while providing the first DC pulse signal,
    wherein:
    the first DC pulse signal is repeated at a first period to include a plurality of cycles, each cycle having the first period and including a first section and a second section subsequent to the first section,
    the first DC pulse signal is at or above a first level during the first section,
    the first DC pulse signal is at or below a second level lower than the first level during the second section, and
    the first section has a duration of 0.1 seconds to 10 seconds, and the second section has a duration of 0.1 seconds to 10 seconds.

2. The method of claim 1, wherein:
    the first DC pulse signal has a constant level at the first level during the first section, and
    the first DC pulse signal has a constant level at the second level during the second section.

3. The method of claim 1, wherein:
    each cycle further comprises a third section subsequent to the second section, and
    the first DC pulse signal is at a third level different from the first level and the second level during the third section.

4. The method of claim 1,
    wherein the level of the first DC pulse signal changes at a constant slope during the first section.

5. The method of claim 1, further comprising:
    providing an RF power signal to a first electrode inside the chamber.

6. The method of claim 5, wherein:
the electromagnet is disposed above the substrate inside the chamber, and
the first electrode is disposed below the substrate.

7. The method of claim 1,
wherein the second level is 0 volts.

8. The method of claim 1, further comprising:
providing the first DC pulse signal to the electromagnet after forming a plasma inside the chamber.

9. The method of claim 1,
wherein forming of the plasma comprises:
providing a source gas into the chamber, and
providing a source power signal to a second electrode inside the chamber.

10. A method of manufacturing a semiconductor device, comprising:
loading a substrate onto a substrate support inside a chamber;
forming a plasma inside the chamber;
providing a first DC pulse signal to a first electromagnet and providing a second DC pulse signal to a second electromagnet, to generate a magnetic field inside the chamber; and
processing the substrate with the plasma, wherein:
the first DC pulse signal is repeated at a first period to include a plurality of first cycles, each first cycle including a first section and a second section subsequent to the first section,
the second DC pulse signal is repeated at a second period to include a plurality of second cycles, each second cycle including a third section and a fourth section subsequent to the third section,
the first DC pulse signal is at a first level during the first section,
the first DC pulse signal is at a second level different from the first level during the second section,
the second DC pulse signal is at a third level during the third section,
the second DC pulse signal is at a fourth level different from the third level during the fourth section, and
the first section, the second section, the third section, and the fourth section each have a duration of 0.1 seconds to 10 seconds.

11. The method of claim 10, wherein:
a level of the first DC pulse signal changes at a first time point,
after the first time point, the next change in level of the second DC pulse signal occurs at a second time point, and
a time between the first time point and the second time point is 0.1 seconds to 10 seconds.

12. The method of claim 10, wherein:
the first section and the third section each have the same starting time point and ending time point, and
the second section and the fourth section each have the same starting time point and ending time point.

13. The method of claim 12, wherein:
the first level and the third level are the same, and
the second level and the fourth level are the same.

14. The method of claim 12, wherein:
the first level and the fourth level are the same, and
the second level and the third level are the same.

15. The method of claim 10, wherein:
the first electromagnet and the second electromagnet comprise solenoids,
providing of the first DC pulse signal to the first electromagnet comprises providing the first DC pulse signal to the first electromagnet in a first direction, and
providing of the second DC pulse signal to the second electromagnet comprises providing the second DC pulse signal to the second electromagnet in the first direction.

16. The method of claim 10, wherein:
the first electromagnet and the second electromagnet comprise solenoids,
providing of the first DC pulse signal to the first electromagnet comprises providing the first DC pulse signal to the first electromagnet in a first direction, and
providing of the second DC pulse signal to the second electromagnet comprises providing the second DC pulse signal to the second electromagnet in a second direction opposite to the first direction.

17. The method of claim 10,
wherein the second level and the fourth level are 0 volts.

18. A method of manufacturing a semiconductor device, comprising:
loading a substrate onto a substrate support inside a chamber;
providing a source power signal to a first electrode inside the chamber to form a plasma inside the chamber;
providing a first DC pulse signal to an electromagnet that generates a magnetic field inside the chamber;
providing an AC signal to a second electrode inside the chamber; and
etching the substrate with the plasma, wherein:
the first DC pulse signal is repeated at a first period to include a plurality of cycles, each cycle including a first section and a second section subsequent to the first section,
the first DC pulse signal is at or above a first level during the first section,
the first DC pulse signal is at a second level different from the first level during the second section, and
the first section has a duration of 0.1 seconds to 10 seconds, and the second section has a duration of 0.1 seconds to 10 seconds.

* * * * *